United States Patent [19]

Asai et al.

[11] Patent Number: 6,048,424
[45] Date of Patent: Apr. 11, 2000

[54] METHOD FOR MANUFACTURING CERAMIC LAMINATED SUBSTRATE

[75] Inventors: Yasutomi Asai, Okazaki; Takashi Nagasaka, Anjo; Kenichi Gohara, Kokubu; Takashi Yamasaki, Kokubu; Yoshiaki Shimojo, Kokubu, all of Japan

[73] Assignee: Denso Corporation, Kariya, Japan

[21] Appl. No.: 09/004,924

[22] Filed: Jan. 9, 1998

[30] Foreign Application Priority Data

Jan. 17, 1997 [JP] Japan .................................. 9-007019

[51] Int. Cl.[7] ...................................................... B32B 31/26
[52] U.S. Cl. .................................. 156/89.16; 156/89.12; 156/252; 29/851
[58] Field of Search .............................. 156/89.12, 89.16, 156/89.17, 89.18, 89.19, 89.21, 252; 29/851; 427/96; 428/210, 901, 209

[56] References Cited

U.S. PATENT DOCUMENTS

| | | |
|---|---|---|
| 3,922,777 | 12/1975 | Weitze et al. . |
| 5,292,574 | 3/1994 | Kata et al. ................. 428/901 X |
| 5,383,093 | 1/1995 | Nagasaka . |
| 5,439,732 | 8/1995 | Nagasaka et al. . |
| 5,456,778 | 10/1995 | Fukuta et al. . |
| 5,554,806 | 9/1996 | Mizuno et al. . |
| 5,562,973 | 10/1996 | Nagasaka et al. . |
| 5,601,672 | 2/1997 | Casy et al. ................. 156/252 X |
| 5,757,611 | 5/1998 | Gurkovich et al. . |

FOREIGN PATENT DOCUMENTS

| | | |
|---|---|---|
| 42 33 403 | 4/1994 | Germany . |
| 5-243330 | 9/1993 | Japan . |

OTHER PUBLICATIONS

Journal of Nippondenso Technical Disclosure, No. 45–158, 1986.
Journal of Nippondenso Technical Disclosure, No. 54–184, 1987.

*Primary Examiner*—Curtis Mayes
*Attorney, Agent, or Firm*—Pillsbury Madison & Sutro LLP

[57] ABSTRACT

Via portions are formed in a first green sheet for a first layer of a laminated substrate. Then, conductive lands are formed on a surface of the first green sheet and a wiring pattern is formed on a back face of the first green sheet to be connected to the conductive lands through the via portions. The thus formed first green sheet is joined to a second green sheet having via portions therein so that the wiring pattern of the first green sheet contacts the via portions of the second green sheet. In this case, by forming the wiring pattern on the back face of the first green sheet, lamination slippage of the wiring pattern caused by lamination of the first and second green sheets can be prevented.

10 Claims, 6 Drawing Sheets

METHOD FOR MANUFACTURING CERAMIC LAMINATED SUBSTRATE

CROSS REFERENCE TO RELATED APPLICATION

This application is based upon and claims the benefit of priority of the prior Japanese Patent Application No. 9-7019 filed on Jan. 17, 1997, the contents of which are incorporated herein by reference.

BACKGROUND OF THE INVENTION

1. Field of the Invention

The present invention relates to a method for manufacturing a ceramic laminated substrate by laminating and baking ceramic green sheets.

2. Related Arts

Figure 1A:
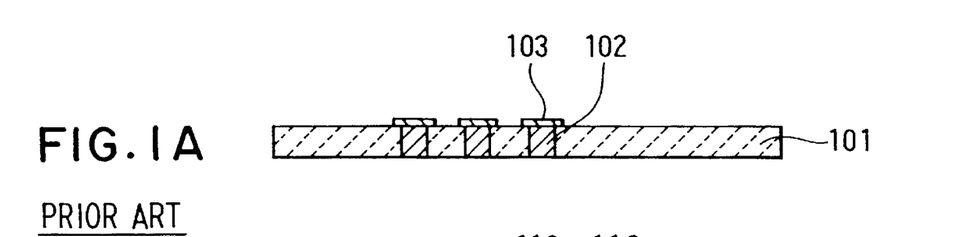
FIGS. 1A to 1C are cross-sectional views for explaining processes for manufacturing a ceramic laminated substrate according to a prior art.
Figure 1B:
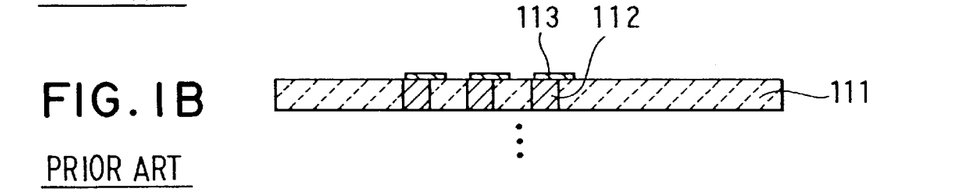

A conventional method for manufacturing a ceramic laminated substrate will be explained referring to FIGS. 1A to 1C. Firstly, via-holes are formed in a ceramic green sheet 101 that is to be a first layer of the laminated substrate, and a conductive material is inserted into the via-holes to form via portions 102 as shown in FIG. 1A. Then, a wiring pattern 103 is formed on the via portions 102. The thus formed green sheet 101 is pressed, thereby being completed. Likewise, via holes are formed in a ceramic green sheet 111 that is to be a second layer, and the via holes are filled with the conductive material, thereby forming via portions 112. Then, after forming a wiring pattern 113 on the via portions 112 as shown in FIG. 1B, the green sheet 112 is completed by pressing. The other green sheets underlying the green sheets 101 and 111 are formed as well.

Figure 1C:
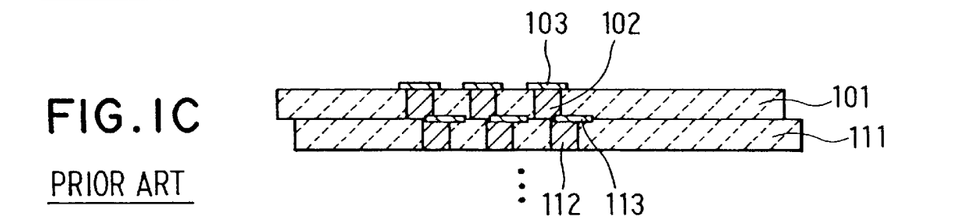

Next, as shown in FIG. 1C, the green sheets from the first layer to the lowermost layer are laminated by thermo-compression bonding, and then are baked. As a result, the ceramic laminated substrate is obtained. The wiring pattern 103 formed on the surface of the first layer of the ceramic substrate includes a plurality of conductive members for serving as conductive lands electrically connected to electrode terminals of a semiconductor chip or the like mounted on the laminated substrate.

Figure 10:
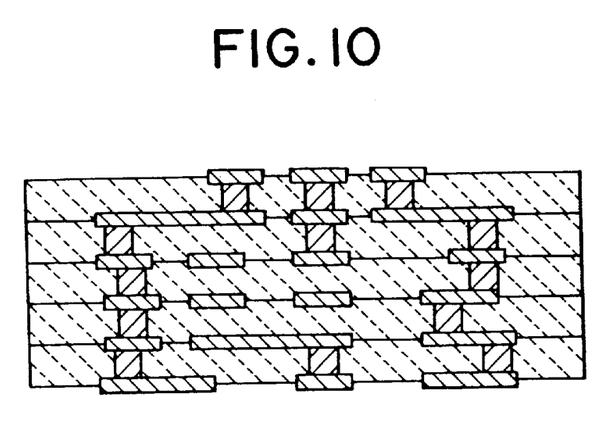
FIG. 10 is a cross-sectional view showing the ceramic laminated substrate formed by the laminated green sheets by baking in the embodiment.

In the above-described method, however, it is difficult to form the wiring pattern accurately on the via portions, resulting in wiring shift as shown in FIG. 1B. Further, when laminating the green sheets 101, 111, . . . , lamination slippage occurs as shown in FIG. 10C. Even if a printing machine having an image recognitive function is employed to form the wiring pattern, it is difficult to prevent the wiring shift of 25 μm at most. (The dimension represents a value after baking the substrate, and hereunder it is the same) Further, even if guide pins are employed to position the green sheets for laminating them, it is difficult to prevent the lamination slippage of 100 μm at most.

Therefore, conventionally, a pitch of the conductive members of the wiring pattern on the via portions and a pitch of the via portions are determined in consideration of the wiring shift and the lamination slippage. For example, in a case that a diameter of each of the via portions is 100 μm, in view of the above-mentioned wiring shift, the wiring pattern on the via portions and the wiring patterns of the underlying green sheets respectively need to have a width of 150 μm at least. Further, the adjacent via portions 102 of the first green sheet 101 are connected to the wiring pattern 113 of the second green sheet 111. Therefore, in view of insulating property, to set the pitch of the wiring pattern 113 on the second green sheet 111 to 50 μm at least, it is necessary to set the pitch of the via portions 102 of the first green sheet 101 to 300 μm at least in the case where each width of the wiring pattern 113 is 150 μm and each diameter of the via portions is 100 μm.

However, a pitch of electrodes of the semiconductor chip mounted on the ceramic laminated substrate has been decreased year by year. Because of this, it is required to reduce the pitch of the via portions of the first green sheets. Especially, in a case that a flip chip IC is connected to the via portions of the first green sheet, the via portions need to be formed at positions substantially corresponding to electrodes of the flip chip IC. A required pitch of the via portions is, for example, 250 μm, and will be 140 μm in the near future. If the above-mentioned method were employed to form a ceramic laminated substrate having via portions with the above-mentioned required pitch, there would arise a problem such that the adjacent via portions short-circuit due to the wiring shift and the lamination slippage as shown in FIG. 1C.

SUMMARY OF THE INVENTION

The present invention has been made in view of the above-mentioned problems and an object of the present invention is to provide a method for manufacturing a ceramic laminated substrate having via portions at a small pitch on a surface thereof, without causing short circuit among the via portions.

According to the present invention, conductive lands are formed on a surface of a first green sheet that is to be a first layer of a ceramic laminated substrate and a wiring pattern is formed on a back face of the first green sheet. The conductive lands are electrically connected to the wiring pattern through first via portions formed in the first green sheet. Then, the first green sheet is laminated on a second green sheet having second via portions therein. In this structure, it is not necessary to consider lamination slippage between the first and second green sheets. That is, disconnection or shift of connection between the conductive lands and the wiring pattern do not occur. Therefore, even if the first via portions are formed in the first green sheet at a small pitch, short-circuit between the adjacent via portions can be prevented.

Preferably, a pitch of the second via portions of the second green sheet is larger than that of the first via portions of the first green sheet. More preferably, the members of the wiring pattern are arranged to extend radially from ends thereof connected to the first via portions of the first green sheet so that the pitch of the first via portions of the second green sheet is increased.

BRIEF DESCRIPTION OF THE DRAWINGS

Other objects and features of the present invention will become more readily apparent from a better understanding of the preferred embodiments described below with reference to the following figures.

DETAILED DESCRIPTION OF THE PREFERRED EMBODIMENT

A preferred embodiment according to the present invention will be described hereinunder with reference to the figures.

Figure 2A:
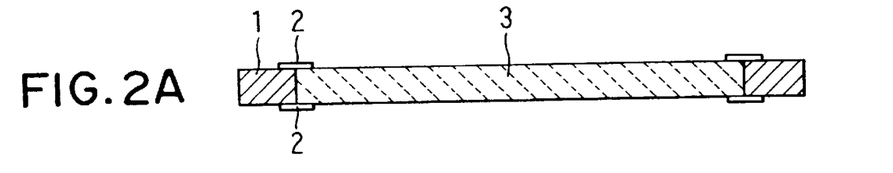
FIGS. 2A to 2F are cross-sectional views for explaining processes for manufacturing a first green sheet that is to be a first layer of a ceramic laminated substrate in a preferred embodiment according to the present invention.
Figure 2B:
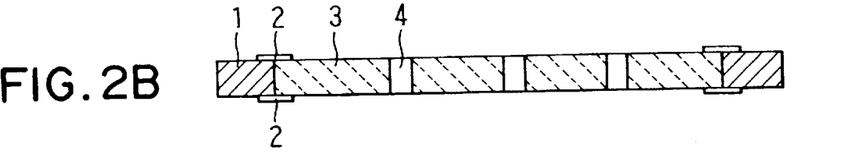
Figure 2C:
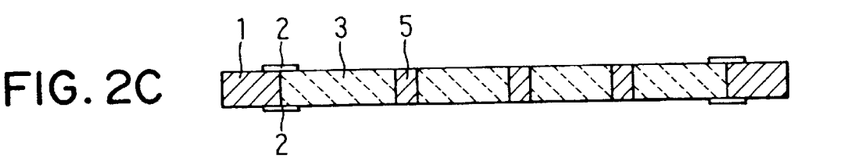

Firstly, processes for manufacturing a green sheet 3 that is to be a first layer of a laminated substrate (a first green sheet) will be explained referring to FIGS. 2A to 2F. As shown in FIG. 2A, the green sheet 3 includes alumina as a main material and is fixed to a guide member 1 made of stainless steel by an adhesive tape 2. Then, as shown in FIG. 2B, via holes 4 respectively having diameters of 100 μm are formed in the green sheet 3 by punching. Next, as shown in FIG. 2C, a conductive material is inserted into the via holes 4 by press fitting, thereby forming via portions 5. The conductive material includes molybdenum (Mo), tungsten (W), or a mixture of Mo and W as a main material.

Figure 2D:
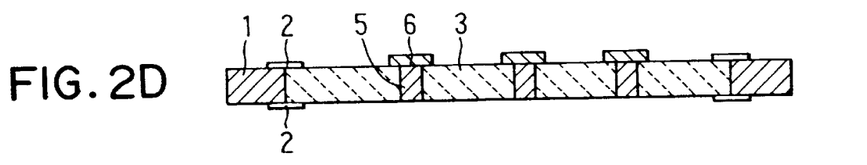
Figure 2E:
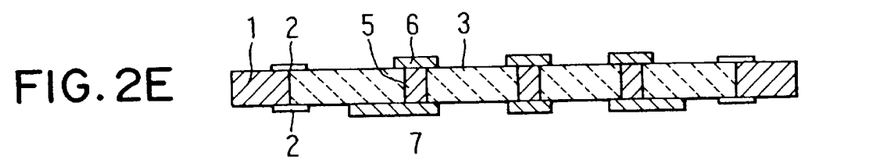
Figure 3:
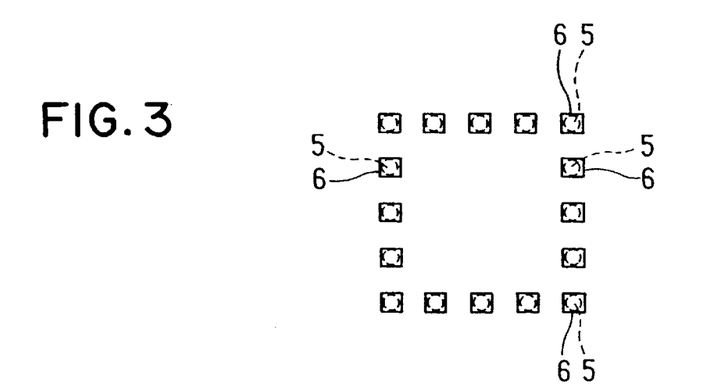
FIG. 3 is a view schematically showing a plan wiring pattern formed on a surface of the first green sheet in a process shown in FIG. 2D.
Figure 4:
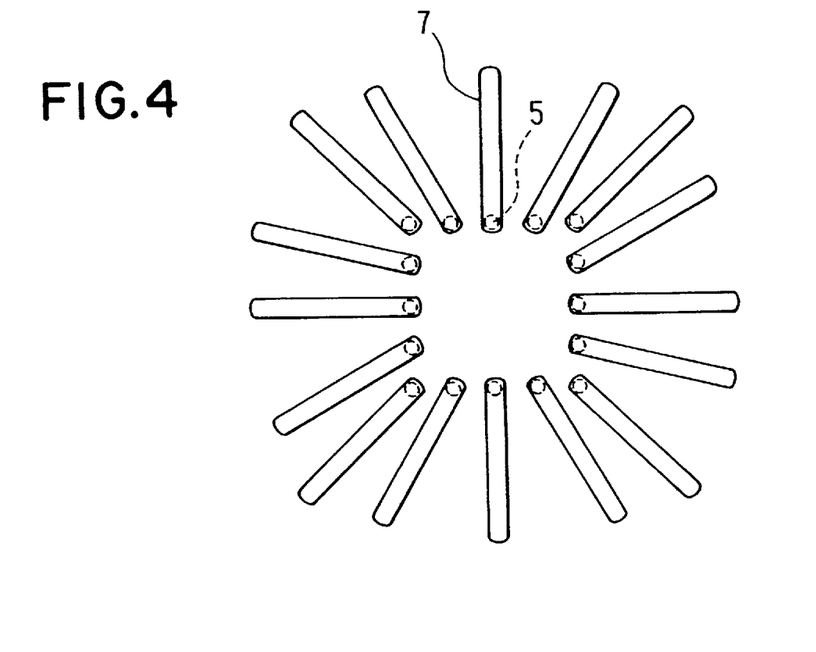
FIG. 4 is a view schematically showing a plan wiring pattern formed on a back face of the first green in a process shown in FIG. 2E.

Then, as shown in FIG. 2D, a wiring pattern 6 including Mo, W, or the mixture of Mo and W as a main material is formed on the surface of the green sheet 3 by printing. The wiring pattern 6 includes a plurality of lands as shown in FIG. 3, and the lands are respectively provided on the via portions 5 to save as conductive lands electrically connected to electrode terminals of a semiconductor chip. Next, as shown in FIG. 2E, a wiring pattern 7 including Mo, W, or the mixture of Mo and W as a main material is formed on a back face of the green sheet 3 opposite to the wiring pattern 6 by printing as well. The wiring pattern 7 includes a plurality of strip-like lands elongating radially from the via portions 5 as shown in FIG. 4. Here, assuming that a wiring shift of 25 μm occurs with respect to the via portions 5 having diameters of 100 μm, each width of the lands of the wiring patterns 6 and 7 is set to be 150 μm and each of the lands of the wiring patterns 6 and 7 is overlapped on a corresponding one of the via portions 5.

Figure 2F:
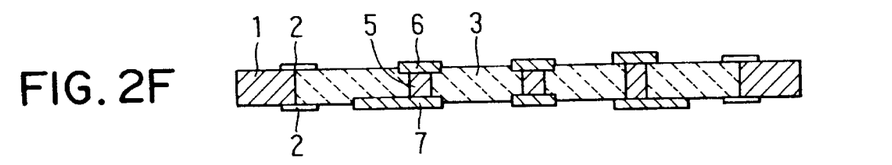
Figure 5A:
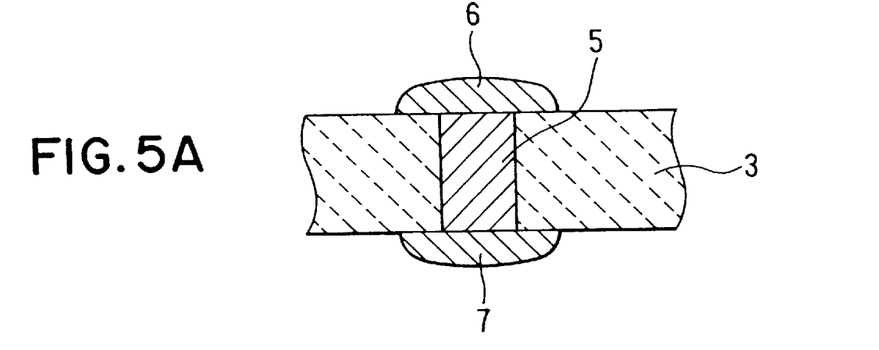
FIGS. 5A and 5B are cross-sectional views showing states of the wiring patterns before and after being pressed.
Figure 5B:
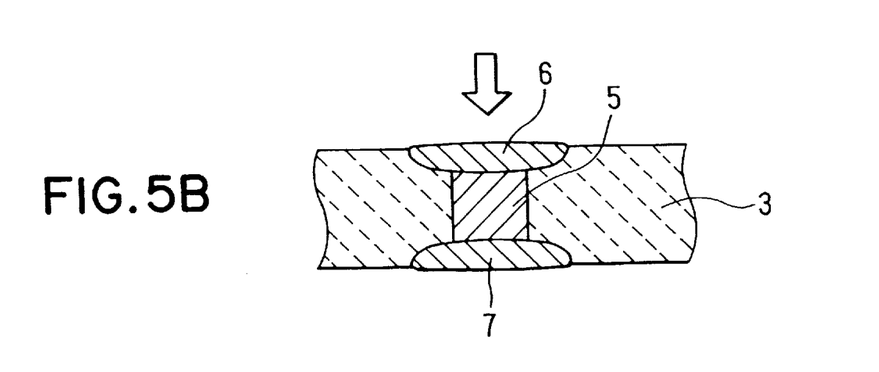

Next, the green sheet 3 are pressed, so that the wiring patterns 6 and 7 are buried into the green sheet 3 as shown in FIG. 2F. By performing the pressing, the surfaces of the wiring patterns 6 and 7 on a pressed side become flatter than the other surfaces of the wiring patterns 6 and 7 on a buried side as shown in FIGS. 5A and 5B. That is, the wiring patterns 6 and 7 are changed from the state shown in FIG. 5A to the state shown in FIG. 5B by the pressing. Accordingly, pores are not likely to be generated around the wiring patterns 6 and 7 when the green sheet 3 is laminated in the subsequent process. In this way, the green sheet 3 for the first layer is completed.

Figure 6A:
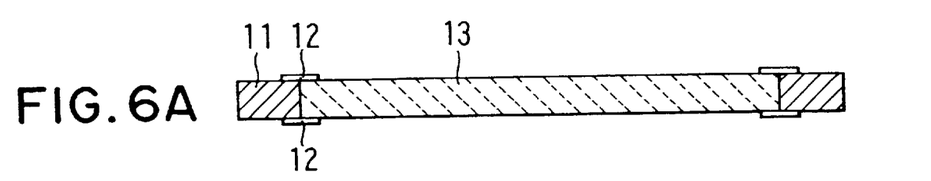
FIGS. 6A to 6C are cross-sectional views for explaining processes for manufacturing a second green sheet that is to be a second layer of the ceramic laminated substrate in the embodiment.
Figure 6B:
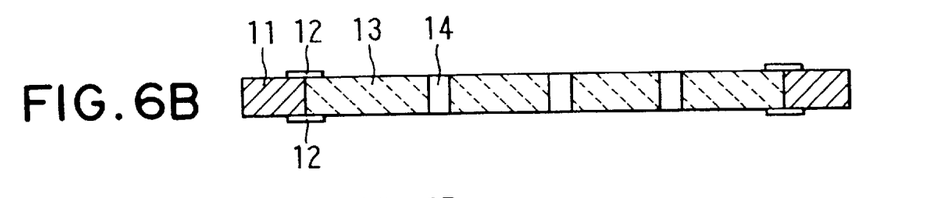
Figure 6C:
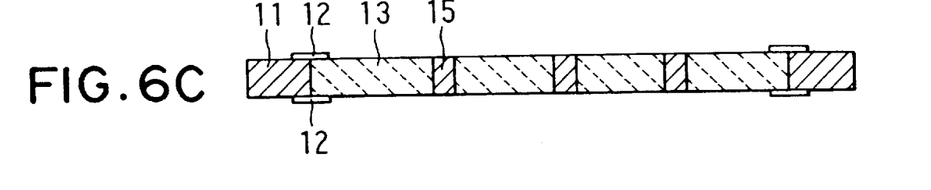
Figure 7:
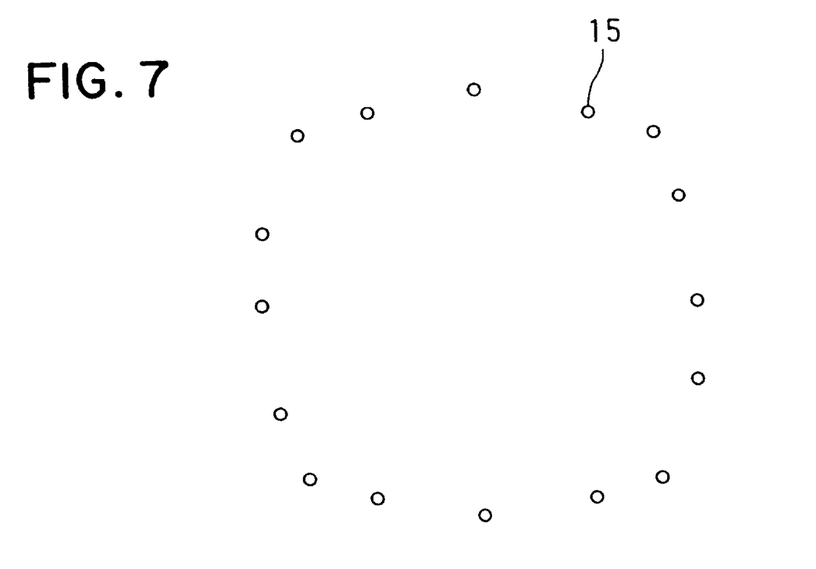
FIG. 7 is a view schematically showing a plan pattern of via portions formed in the second green sheet in a process shown in FIG. 6C.

Next, processes for manufacturing a green sheet 13 that is to be a second layer of the laminated substrate (a second green sheet) will be explained. Specifically, in processes shown in FIGS. 6A to 6C, the green sheet 13 is fixed to a guide member 11 by an adhesive tape 12, and via holes 14 having diameters of 100 μm are formed in the green sheet 13 by punching. Then, a conductive material is inserted into the via holes 14 by press fitting, thereby forming via portions 15. These processes are similar to those of the green sheet 3 for the first layer. However, a wiring pattern is not formed on the green sheet 13 for the second layer. FIG. 7 shows a plan pattern of the via portions 15 formed in the green sheet 13. As understood from FIGS. 3 and 7, a pitch (an interval) between adjacent two via portions 15 is larger than that between adjacent two via portions 5 formed in the green sheet 3 for the first layer.

Figure 8A:
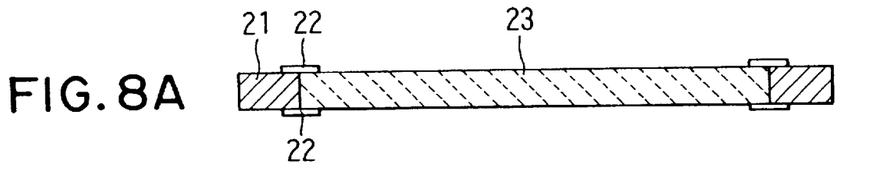
FIGS. 8A to 8E are cross-sectional views for explaining processes for manufacturing one of third and fourth green sheets that is to be third and fourth layers of the ceramic laminated substrate.
Figure 8B:
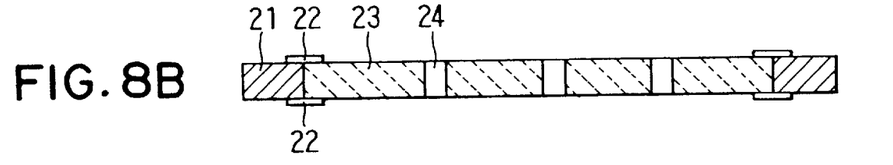
Figure 8C:
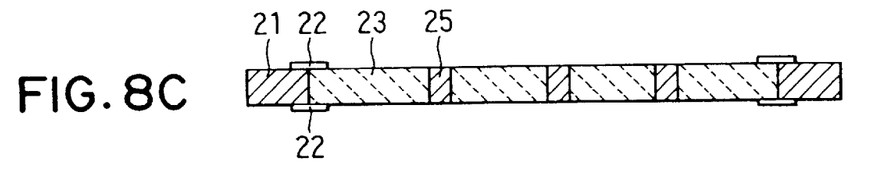
Figure 8D:
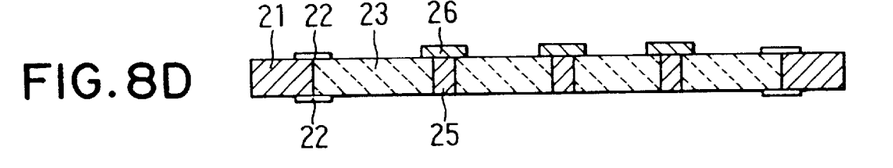
Figure 8E:
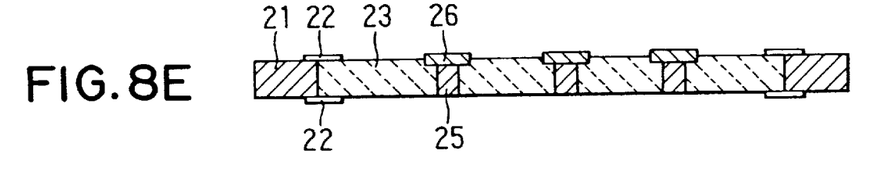

Subsequently, green sheets for third and fourth layers are manufactured. That is, as shown in FIGS. 8A to 8C, a green sheet 23 is fixed to a guide member 21 by an adhesive tape 22, and via holes 24 having diameters of 100 μm are formed in the green sheet 23. Then, a conductive material is inserted into the via holes 24 by press fitting to form via portions 24. These processes are the same as those for the first and second layers. Next, in a process shown in FIG. 8D, a wiring pattern 26 is formed on the surface of the green sheet 23. Then, in a process shown in FIG. 8E, the green sheet 23 is pressed. In this way, the green sheet 23 for the third or fourth layers is completed. Another green sheet for the third or fourth layers is formed as well.

Thereafter, a green sheet for a fifth layer is manufactured. In this case, after forming a wiring pattern on a surface of a green sheet in the same way as the third and fourth green sheets, another wiring pattern is formed on the back face of the green sheet in the same way as the first green sheet 3. The second to fifth green sheets are made of the same material as that of the first green sheet 3, and likewise, the conductive material filling the via holes and the material for the wiring patterns of the second to fifth green sheets are the same as those of the first green sheet 3.

Figure 9:
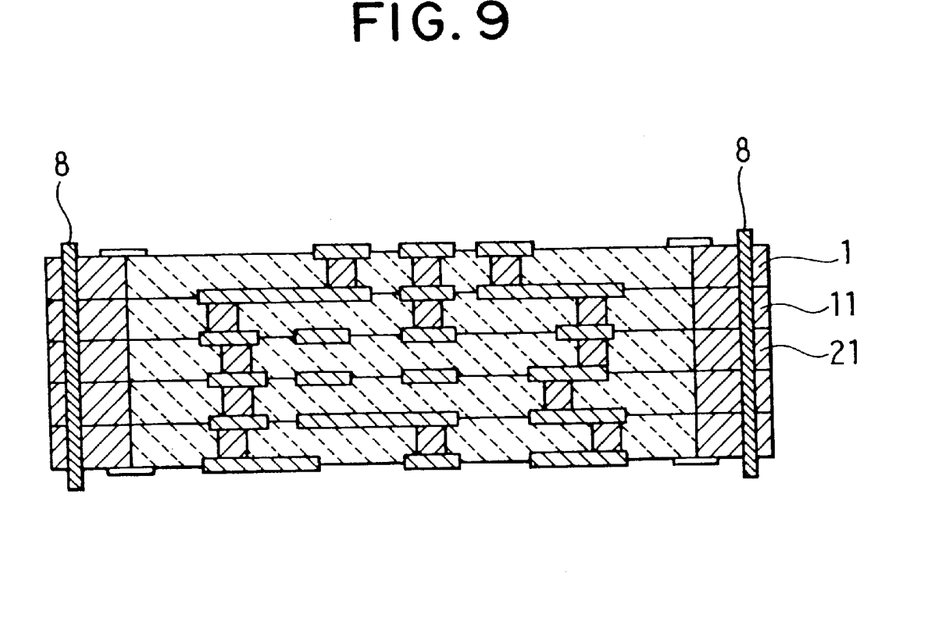
FIG. 9 is a cross-sectional view showing a state of the first to fifth green sheets laminated by thermo-compression bonding in the embodiment.

In this way, the first to fifth green sheets are formed. Then, as shown in FIG. 9, the green sheets are laminated by thermo-compression bonding. The guide members 1, 11, 21, . . . for fixing the green sheets thereto respectively have holes for receiving guide pins 8 therein. By inserting the guide pins 8 into the holes, the positioning of the green sheets is performed. After thermally bonding the green sheets, the laminated green sheets are cut to be separated from the guide members, and then are baked at a high temperature of approximately 1300° C.–1700° C. As a result, the ceramic laminated substrate shown in FIG. 10 can be obtained.

According to the above-mentioned method for manufacturing the ceramic laminated substrate, the green sheet 3 serving as the first layer has the conductive lands 6 on the surface thereof and the wiring pattern 7 on the back face thereof. Therefore, it is not necessary to consider the lamination slippage caused by the lamination of the first and second layers (lamination of the green sheets 3 and 13). Accordingly, the minimum pitch of the via portions 5 (minimum interval between the adjacent two via portions 5) of the green sheet 3 can be decreased by a length corresponding to the lamination slippage (100 μm at most). That is, in the case where the pitch of the via portions 5 is conventionally required to be 300 μm, the pitch of the via portions 5 can be decreased to be 200 μm by employing the structure of the present invention. To decrease the pitch of the via portions 5 more, each diameter of the via portions 5 may be decreased. For example, when each diameter of the via portions 5 is 50 μm and each width of the lands of the wiring patterns 6 and 7 is 90 μm, the via portions 5 can be formed at a pitch of 140 μm. That is, it is not necessary to consider the lamination slippage.

On the other hand, the wiring pattern 7 formed on the back face of the green sheet 3 includes the strip-like lands elongating radially from the corresponding via portions 5. Further, the pitch of the via portions 15 of the green sheet 13 for the second layer is set to be larger than that of the via portions 5 of the green sheet 3 for the first layer. Accordingly, the interval between the adjacent strip-like lands of the wiring pattern 7 that are connected to the adjacent via portions 5 can be secured to the maximum. By employing this manufacturing method, even if the via portions 5 are formed in the green sheet 3 at a small pitch, the short-circuit between the adjacent via portions 5 can be prevented.

In the above mentioned embodiment, although the green sheets are mainly made of alumina, the green sheets may be made of the other materials such as glass ceramic. When the glass ceramic is employed as the main material for the green sheets, it is preferable that the wiring patterns are mainly made of silver or gold. In this case, it is not necessary to form a metallic plating layer on the surfaces of the conductive lands. The conductive lands can be directly connected to the electrodes of the semiconductor chip by soldering or wire bonding. When using the glass ceramic for the green sheets, it is preferable that the green sheets are baked at 800° C. to 1000° C.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A method of forming a ceramic laminated substrate having conductive lands on a main surface thereof, the method comprising:

forming first via holes in a first ceramic green sheet, the first green sheet being for a first layer of the substrate and having a surface defining a main surface of the substrate;

filling the first via holes with a conductive member to form first via portions;

forming the conductive lands respectively on the first via portions on the surface of the first green sheet;

forming a wiring pattern respectively on the first via portions on a back face of the first green sheet opposite to the conductive lands to be electrically connected to the conductive lands through the first via portions;

forming second via holes in a second ceramic green sheet at positions corresponding to the wiring pattern, the second green sheet being for a second layer of the substrate;

filling the second via holes with a conductive member to form second via portions;

laminating the first and second green sheets to make electrical contacts between the second via portions and the conductive lands through the first via portions and the wiring pattern; and baking the first and second green sheets, wherein the first via portions are formed at a first pitch, and the second via portions are formed at a second pitch larger than the first pitch.

2. The method of claim 1, further including a step of pressing the first green sheet after forming the wiring pattern on the back face of the first green sheet.

3. The method of claim 1, further including a step of preparing a third green sheet having third via portions therein and upper and lower wiring patterns on both surfaces thereof, the upper and lower wiring patterns being electrically connected to each other through the third via portions, wherein the third green sheet is laminated with the first and second green sheets to make electrical contacts between the lower wiring pattern of the third green sheet and the conductive lands of the first green sheet through the first via portions, the wiring pattern of the first green sheet, the second via portions of the second green sheet, the upper wiring pattern, and the third via portions of the third green sheet.

4. The method of claim 3, further including a step of preparing an intermediate green sheet having intermediate via portions therein and an intermediate wiring pattern contacting the intermediate via portions on a surface thereof, the intermediate green sheet to be interposed between the second green sheet and the third green sheet with the intermediate wiring pattern contacting the second via portions, wherein the intermediate green sheet is laminated with the first, second, and third green sheets and is baked.

5. A method of forming a ceramic laminated substrate having conductive lands on a main surface thereof, the method comprising:

forming first via holes in a first ceramic green sheet, the first green sheet being for a first layer of the substrate and having a surface defining a main surface of the substrate;

filling the first via holes with a conductive member to form first via portions;

forming the conductive lands respectively on the first via portions on the surface of the first green sheet;

forming a wiring pattern respectively on the first via portions on a back face of the first green sheet opposite to the conductive lands to be electrically connected to the conductive lands through the first via portions;

forming second via holes in a second ceramic green sheet at positions corresponding to the wiring pattern, the second green sheet being for a second layer of the substrate;

filling the second via holes with a conductive member to form second via portions;

laminating the first and second green sheets to make electrical contacts between the second via portions and the conductive lands through the first via portions and the wiring pattern; and baking the first and second green sheets, wherein the wiring pattern is formed to have a plurality of wiring members respectively connected to the first via portions at ends thereof and extending radially from the ends on the back face of the first green sheet.

6. The method of claim 5, wherein the wiring members of the wiring pattern are connected to the second via portions at the other ends thereof.

7. The method of claim 6, wherein an interval between adjacent two wiring members of the wiring pattern at the ends thereof connected to the first via portions is smaller than that at the other ends thereof connected to the second via portions.

8. The method of claim 5, further including pressing the first green sheet after forming the wiring pattern on the back face of the first green sheet.

9. The method of claim 5, further including preparing a third green sheet having third via portions therein and upper and lower wiring patterns on both surfaces thereof, the upper and lower wiring patterns electrically connected to each other through the third via portions, wherein the third green sheet is laminated with the first and second green sheets to make electrical contacts between the lower wiring pattern of the third green sheet and the conductive lands of the first green sheet through the first via portions, the wiring pattern of the first green sheet, the second via portions of the second green sheet, the upper wiring pattern and the third via portions of the third green sheet.

10. The method of claim 9, further including preparing an intermediate green sheet having intermediate via portions therein and an intermediate wiring pattern contacting the intermediate via portions on a surface thereof, the intermediate green sheet being to be interposed between the second green sheet and the third green sheet with the intermediate wiring pattern contacting the second via portions, wherein the intermediate green sheet is laminated with the first, second, and third green sheets and is baked.

* * * * *